United States Patent
Tsukagoshi

(10) Patent No.: US 8,253,159 B2
(45) Date of Patent: Aug. 28, 2012

(54) SEMICONDUCTOR LIGHT EMITTING DEVICE AND SEMICONDUCTOR LIGHT EMITTING UNIT

(75) Inventor: Kouji Tsukagoshi, Gunma (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 516 days.

(21) Appl. No.: 12/408,136

(22) Filed: Mar. 20, 2009

(65) Prior Publication Data
US 2009/0242906 A1    Oct. 1, 2009

(51) Int. Cl.
*H01L 29/22* (2006.01)
*H01L 29/18* (2006.01)
(52) U.S. Cl. ............... 257/99; 257/81; 257/88; 257/676
(58) Field of Classification Search .............. 257/81, 257/84, 88, 91, 98, 99, 100, 668, 676, 690, 257/692, 693, E33.068
See application file for complete search history.

(56) References Cited

U.S. PATENT DOCUMENTS
2007/0235743 A1 * 10/2007  Lee et al. ............... 257/81

FOREIGN PATENT DOCUMENTS

| JP | 08/306962 | 11/1996 |
| JP | 11/163411 | 6/1999 |
| JP | 11/176212 | 7/1999 |
| JP | 2002/223005 | 8/2002 |
| JP | 2004/207542 | 7/2004 |
| JP | 2004/311916 | 11/2004 |

* cited by examiner

*Primary Examiner* — Hung Vu
(74) *Attorney, Agent, or Firm* — Wilmer Cutler Pickering Hale and Dorr LLP

(57) ABSTRACT

A semiconductor light emitting device includes: an outer surrounding body having a recessed portion formed in an upper surface of the outer surrounding body; a lead terminal led out from a side surface of the outer surrounding body; and a semiconductor light emitting element disposed in the recessed portion. The outer surrounding body has a cut portion formed at a corner defined by a cross point of extension lines of adjacent sides in a planar outline of the outer surrounding body viewed from the upper surface of the outer surrounding body. The lead terminal is led out from the cut portion.

5 Claims, 3 Drawing Sheets

SEMICONDUCTOR LIGHT EMITTING DEVICE AND SEMICONDUCTOR LIGHT EMITTING UNIT

CROSS-REFERENCE TO RELATED APPLICATIONS

This application is based upon and claims priority from Japanese Utility Model Application No. 2008-1947 filed on Mar. 31, 2008, the entire contents of which are incorporated herein by reference.

BACKGROUND OF THE INVENTION

1. Technical Field

The present invention relates to a semiconductor light emitting device and a semiconductor light emitting unit including semiconductor light emitting devices disposed in parallel to each other therein, and in particular to a surface-mount semiconductor light emitting device and a semiconductor light emitting unit including the surface-mount semiconductor light emitting devices arranged in parallel to each other therein.

2. Description of the Related Art

FIG. 6 shows a semiconductor light emitting device, which is described, for example, in JP-A-8-306962. In the semiconductor light emitting device, a semiconductor light emitting element 13 is provided on a bottom surface of a base portion 12 having a recessed cup-shaped portion 11. In other words, the semiconductor light emitting element 13 is disposed on a bottom surface of the cup-shaped portion 11. The cup-shaped portion 11 is filled with a resin 14. An electrode of the semiconductor element 13 is electrically connected to a lead terminal 15 led out from the base portion 12. As shown in FIG. 6, in the semiconductor light emitting device, the lead terminals 15 are led out from a pair of opposing side surfaces of the base portion 12 having a substantially rectangular shape in plan view.

In the above-described semiconductor light emitting device, the lead terminals 15 is led out in the direction separating from the base portion 12, which increases a mount area of the semiconductor light emitting device. In recent years, a light emitting unit including a plurality of semiconductor light emitting devices arranged in parallel to each other is used as a light source for back lighting such as a liquid crystal display television. In such a case, an increase in the mount area of a semiconductor light emitting device increases the size of the light source. Further, when a plurality of semiconductor light emitting devices are arranged in parallel along a direction in which the lead terminals 15 extends, portions which no light emitting occur between adjacent semiconductor light emitting devices, in addition to an increase in the mount area described above. Therefore, when a plurality of semiconductor light emitting devices are disposed in parallel to each other, these devices will be disposed in the direction from which the lead terminals 15 are led out, wherein there is a restriction in the disposing direction of the semiconductor light emitting devices.

BRIEF SUMMARY OF THE INVENTION

The present invention was made in consideration of the above circumstances, and an object thereof is to provide a semiconductor light emitting device with a small mount area.

According to a first aspect of the invention, there is provided a semiconductor light emitting device comprising: an outer surrounding body having a recessed portion formed in an upper surface of the outer surrounding body; a lead terminal led out from a side surface of the outer surrounding body; and a semiconductor light emitting element disposed in the recessed portion, wherein the outer surrounding body has a cut portion formed at a corner defined by a cross point of extension lines of adjacent sides in a planar outline of the outer surrounding body viewed from the upper surface of the outer surrounding body, and wherein the lead terminal is led out from the cut portion.

According to a second aspect of the invention, there is provided a semiconductor light emitting device comprising: an outer surrounding body; a metallic body covered by the outer surrounding body; a lead terminal led from a side surface of the outer surrounding body; and a semiconductor light emitting element disposed on the metallic body, wherein the outer surrounding body has a recessed portion that exposes a part of the metallic body, wherein the semiconductor light emitting element is disposed in the recessed portion and covered by a light transmitting resin, and wherein the outer surrounding body has a cut portion formed at a corner defined by a cross point of extension lines of adjacent sides of a planar outline of the outer surrounding body viewed from an upper surface of the outer surrounding body, and wherein the lead terminal is led out from the cut portion.

According to a third aspect of the invention, there is provided a semiconductor light emitting unit comprising: a first semiconductor light emitting device; a second semiconductor light emitting device; and an electrode, wherein each of the first semiconductor light emitting device and the second semiconductor light emitting device comprises: an outer surrounding body having a recessed portion formed on an upper surface of the outer surrounding body; a lead terminal led out from a side surface of the outer surrounding body; and a semiconductor light emitting element disposed in the recessed portion, wherein the outer surrounding body has a cut portion formed at a corner defined by a cross point of extension lines of adjacent sides in a planar outline of the outer surrounding body viewed from the upper surface of the outer surrounding body, and wherein the lead terminal is led out from the cut portion; wherein one side surface of the outer surrounding body of the first semiconductor light emitting device is arranged to oppose in parallel to one side surface of the outer surrounding body of the second semiconductor light emitting device, such that the cut portion of the first semiconductor light emitting device opposes the cut portion of the second semiconductor light emitting device, and wherein the lead terminal of the first semiconductor light emitting device and the lead terminal of the second semiconductor emitting device are connected to the electrode.

DETAILED DESCRIPTION OF THE EMBODIMENT

A semiconductor light emitting device according to an embodiment of the present invention is described with reference to FIG. 1 to FIG. 4.

Figure 1:
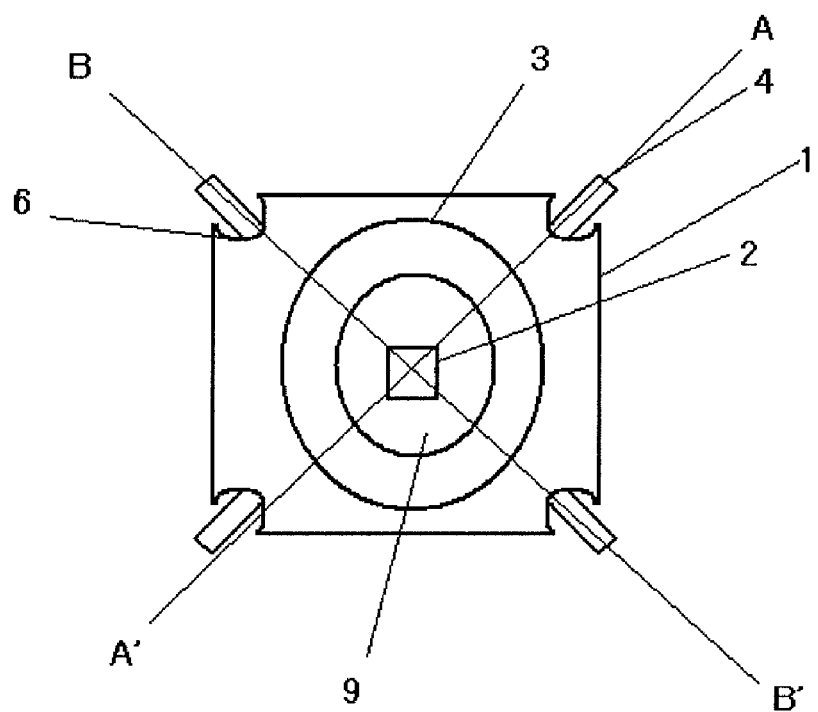
FIG. 1 is a plan view of a semiconductor light emitting device according to an embodiment of the present invention.

As shown in FIG. 1, a semiconductor light emitting device includes: an outer surrounding body 1; a plurality of lead terminals 4 led out from side surfaces of the outer surrounding body 1; a recessed portion 3 formed in the upper surface of the outer surrounding body 1; and a semiconductor light emitting element 2 disposed in the recessed portion 3. The outer surrounding body 1 has a cut portion 6 at the corners where the extension lines of adjacent sides of the outer profile cross each other as viewed from the upper surface of the outer surrounding body 1. The lead terminals 4 are led out from the cut portions 6.

Figure 2:
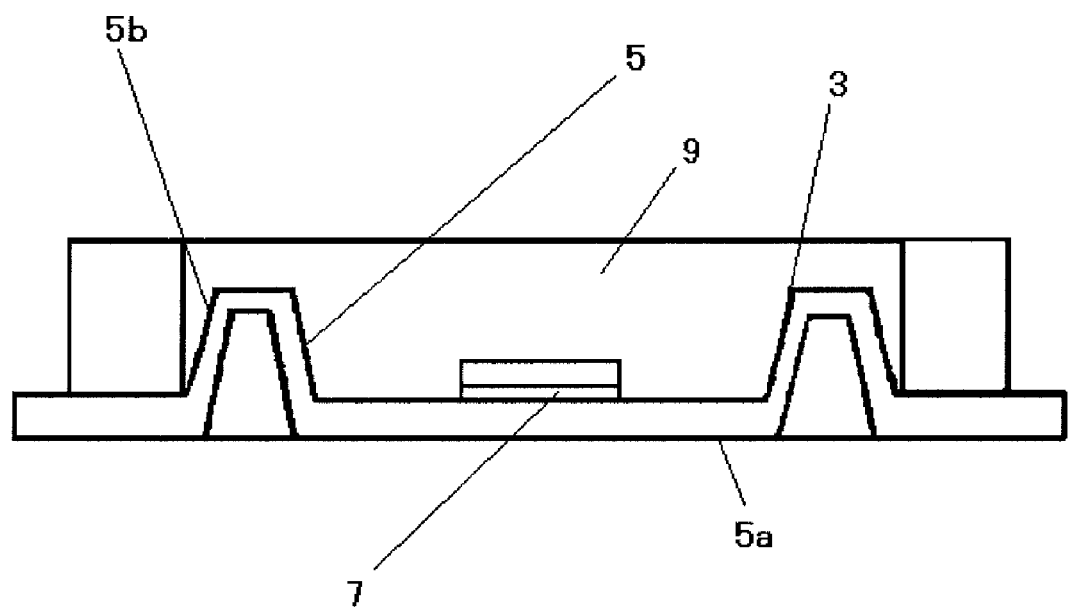
FIG. 2 is a sectional view taken along a line A-A' of FIG. 1.

As shown in FIG. 2, the semiconductor light emitting device further includes a metallic body 5. The metallic body 5 is formed, for example, of a lead frame. The metallic body 5 includes: a recessed first portion 5a in which the semiconductor light emitting element 2 is mounted; and second portions 5b having a band shape and extending from four of the first portion 5a to an outside thereof.

A semiconductor light emitting element 2 is fixed to the upper surface of the first portion 5a via a conductive adhesive material such as solder 7, etc. The first portion 5a includes: a plate-shaped bottom surface to which the semiconductor light emitting element 2 is fixed; and a sidewall portion annularly enclosing the bottom surface. The first portion 5a has a substantially circular or rectangular shape in plan view (as viewed from above). Also, the sidewall portion is inclined such that a diameter of the sidewall portion increases toward upward (toward an opening portion side of the outer surrounding body 1), and functions as a reflector that reflects light emitted from the semiconductor light emitting element 2 and leads the light upward.

Figure 3:
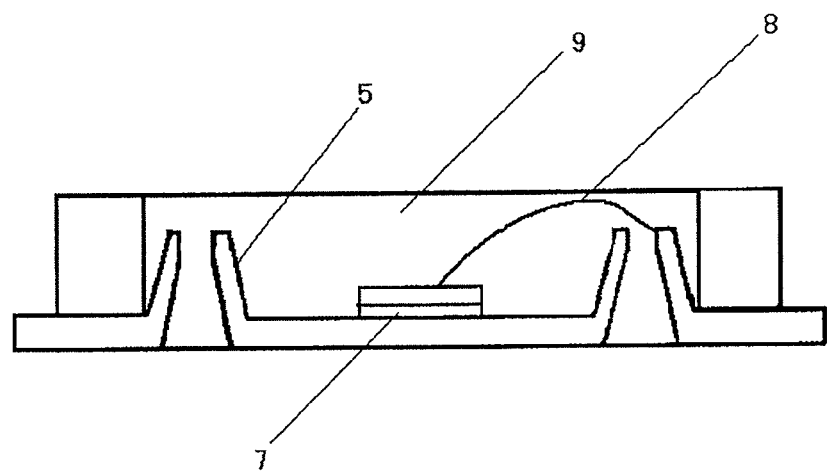
FIG. 3 is a sectional view taken along the line B-B' of FIG. 1.

The second portion 5b of the metallic body 5 is disposed adjacent to the upper end of the sidewall portion. One pair of end portions of the second portion 5b is connected to the upper end of the sidewall portion as shown in FIG. 2, and the other pair of end portions of the second portion 5b are disposed so as to be separated from the upper end of the sidewall portion as shown in FIG. 3. As shown in FIG. 2, the second portion 5b extends outward from the upper end of the sidewall portion, extends downward (toward the first portion side 5a in a vertical direction) and is led out from the outer surrounding body 1 to the outside thereof. As shown in FIG. 3, an upper surface electrode of the semiconductor light emitting element 2 is connected to the second portion 5b separated from the sidewall portion via a wire 8. The second portion is led out from the outer surrounding body 1 to the outside thereof and configures the lead terminal 4.

When a substrate (base) of a semiconductor light emitting diode is not formed of a conductive substrate such as silicon, SiC, etc., but of a non-conductive substrate such as sapphire, etc., a plurality of electrodes are disposed on the upper surface of the semiconductor light emitting element 2. In this case, all the second portions 5b are separated from the first portion 5a of the metallic body 5, and the electrodes on the upper surface of the semiconductor light emitting element 2 and the second portions 5b of the metallic body 5 may be electrically connected to each other via wires, respectively.

A resin 9 having a light transmission property is formed in the recessed portion 3 formed in the upper surface of the outer surrounding body 1. The resin 9 is filled in the recessed first portion 5a of the metallic body 5, and covers the semiconductor light emitting element 2 fixed to the first portion 5a. It is preferable that the resin contains a material having a heat resistance property and a light transmission property. Epoxy resin or silicone resin is preferable from this aspect. In addition, a fluorescent body and a light scattering material, which converts the wavelength of light emitted from the semiconductor light emitting element 2, may be contained in the resin.

The semiconductor light emitting element 2 may be a gallium-based compound semiconductor chip such as gallium arsenide (GaAs), gallium phosphide (GaP), gallium aluminum arsenide (GaAlAs), aluminum gallium indium phosphide (AlGaInP), Gallium nitride (GaN), etc. Although only one semiconductor light emitting element 2 is fixed to the first portion 5a of the metallic body 5 in this embodiment, a plurality of semiconductor light emitting elements 2 may be fixed. Further, the semiconductor light emitting element 2 may be a chip other than a blue light emitting element.

The outer surrounding body 1 may be formed of resin that is not transparent, for example, liquid crystal polymer with which white powder is blended. The cut portion 6 of the outer surrounding body 1 may be formed by being arcuately cut out toward the inside (the cup-shaped portion 3 side) of the outer surrounding body 1. In the semiconductor light emitting device according to the present embodiment, by exposing the lead terminal 4 from the side surface positioned in the cut portion 6, the semiconductor light emitting device can be mounted in a further narrower space.

Figure 4:
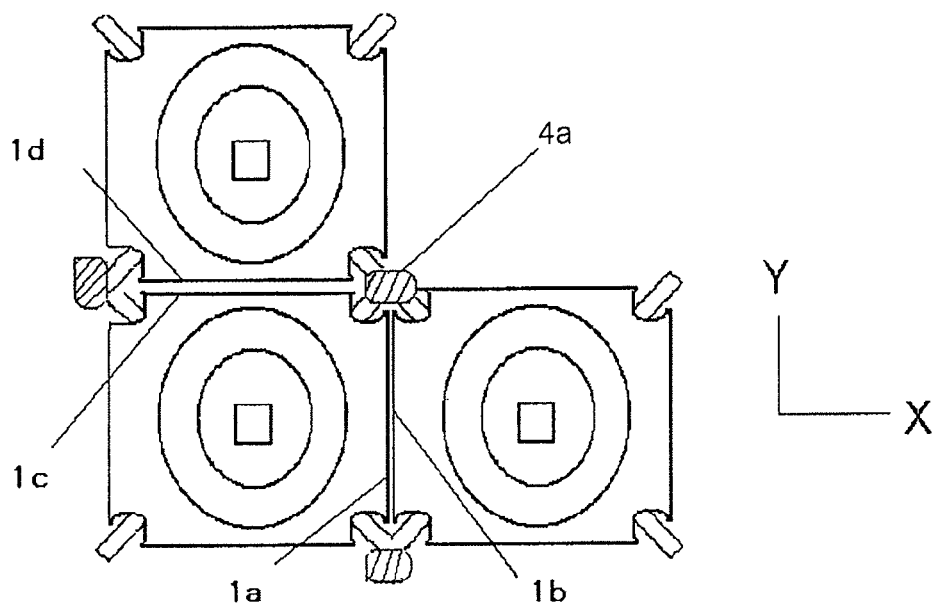
FIG. 4 is a plan view showing a semiconductor light emitting unit according to an embodiment of the present invention.

FIG. 4 shows a semiconductor light emitting unit according to an embodiment of the present invention. The semiconductor light emitting unit includes the above-described semiconductor light emitting devices arrayed and disposed such that the lead terminals 4 thereof oppose one another. Also, components that are substantially identical to those of the semiconductor light emitting devices described above are given the same reference numerals and letters, and detailed description thereof is omitted.

A cut portion 6 formed having an arc shape is formed at corners on the diagonal lines of the outer surrounding body 1, and the lead terminals 4 are exposed from the cut portions 6. A plurality of semiconductor light emitting devices are disposed adjacent to each other in the X-axis direction and the Y-axis direction opposed thereto, thereby configuring a planar light source. The adjacent semiconductor light emitting devices adjacent are disposed such that the sides of the respective outer surrounding body 1 are proximate to each other (oppose in parallel each other), and the lead terminals 4 led out from the cut portions 6 connected to the sides disposed proximately to each other are connected to a same electrode 4a.

That is, the side 1a of the outer surrounding body 1 of the first semiconductor light emitting device is disposed adjacent to the side 1b of the outer surrounding body 1 of the second semiconductor light emitting device that is disposed in parallel to the first semiconductor light emitting device in the X-axis direction, and the lead terminal 4 led out from the cut portion 6 formed on the extension portion of the side 1a of the first semiconductor light emitting device and the lead terminal 4 led out from the cut portion 6 formed on the extension portion of the side 1b of the second semiconductor light emitting device are connected to the same electrode 4a.

In addition, the side 1c of the outer surrounding body 1 of the first semiconductor light emitting device is disposed adjacent to the side 1d of the outer surrounding body 1 of the third semiconductor light emitting device that is disposed in parallel to the first semiconductor light emitting device in the Y-axis direction, and the lead terminal 4 led out from the cut portion 6 formed on the extension portion of the side 1c of the first semiconductor light emitting device and the lead terminal 4 led out from the cut portion 6 formed on the extension portion of the side 1*d* of the third semiconductor light emitting device are connected to the same electrode 4*a*.

In the semiconductor light emitting unit according to the present embodiment, by exposing the lead terminal 4 from the side of the cut portion 6, the semiconductor light emitting devices can be mounted in a further narrower space, the mount area of the semiconductor light emitting devices can be reduced, and a small-sized planar light source can be provided. Further, the non-light emitting area can be reduced, and a small-sized planar light source with improved brightness can be provided.

Figure 5:
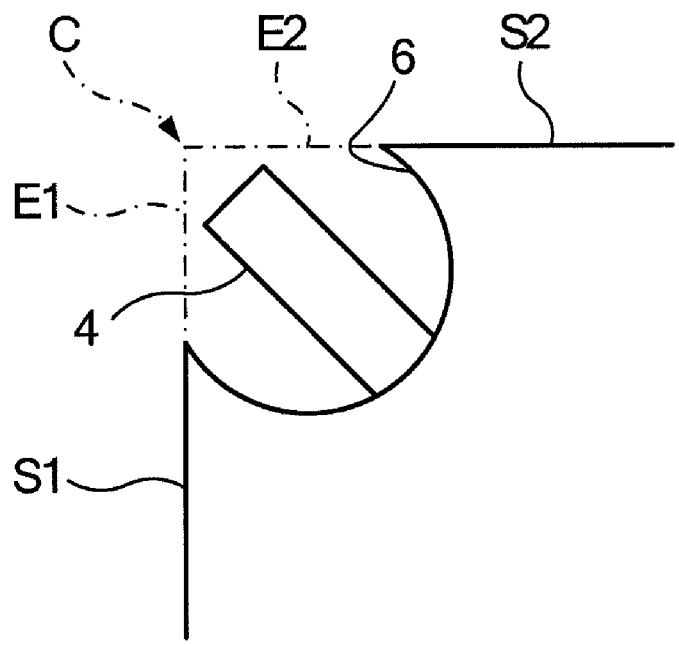
FIG. 5 is an enlarged plan view of a cut portion according to another embodiment of the invention.
Figure 6:
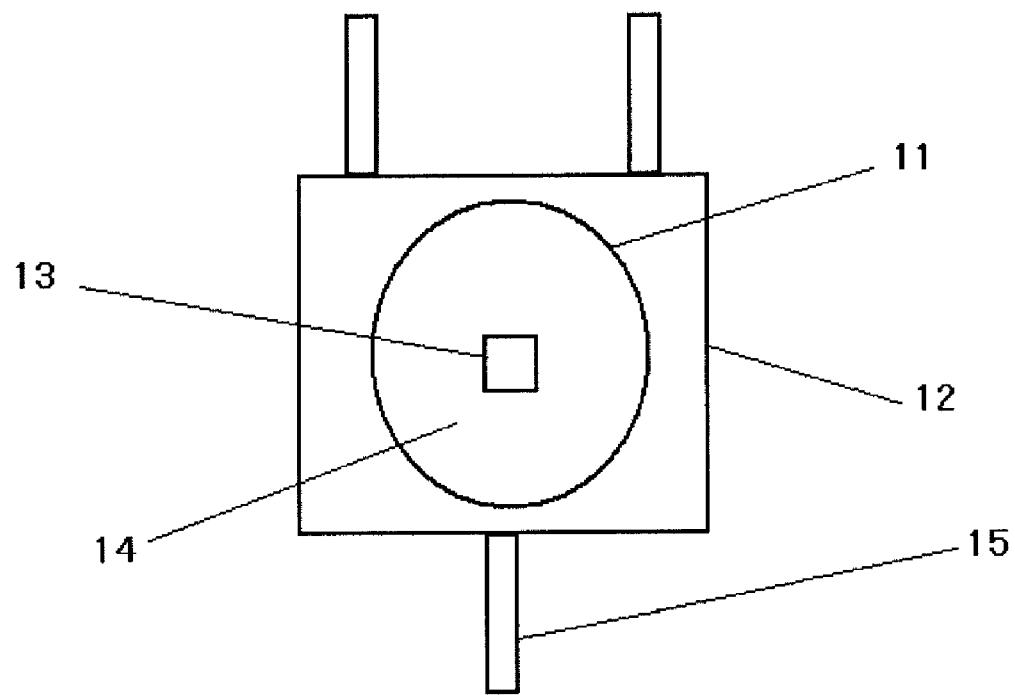
FIG. 6 is a plan view showing a related-art semiconductor light emitting device.

In the above-described embodiments, the lead terminal 4 protrudes outside of a corner defined by a cross point of extension lines of adjacent sides in plan view. However, as shown in FIG. 5, a distal end of the lead terminal 4 may be located within an area defined by the outline of the cut portion 6 and extension lines E1, E2 of the respective adjacent sides S1, S2 in plan view. That is, the distal end of the lead terminal 4 may be located inside than the corner C. Accordingly, the mount area of the semiconductor light emitting devices can be further reduced.

The semiconductor light emitting device according to the present invention has a cut portion at the corners of the outer surrounding body, and a lead terminal is led out from the cut portion. Accordingly, it is possible to connect the lead terminal to an electrode of a circuit substrate, etc., without leading out the lead terminal from respective sides of the outer surrounding body to the outside thereof. Therefore, it becomes possible to mount the semiconductor light emitting devices in a further narrower space than in the prior art. In addition, when a plurality of semiconductor light emitting devices are disposed in parallel to each other since the lead terminals are led out from the cut portions secured at the corners of the outer surrounding body, the lead terminals adjacent to each other can be connected to one electrode, wherein the mount area can be reduced. Further, non-light emitting portions hardly occur between adjacent semiconductor light emitting devices.

What is claimed is:

1. A semiconductor light emitting device comprising:
   an outer surrounding body having a recessed portion formed in an upper surface of the outer surrounding body;
   a lead terminal led out from a side surface of the outer surrounding body; and
   a semiconductor light emitting element disposed in the recessed portion,
   wherein the outer surrounding body has a cut portion formed at a corner defined by a cross point of extension lines of adjacent sides in a planar outline of the outer surrounding body viewed from the upper surface of the outer surrounding body, and
   wherein the lead terminal is protruded out from the cut portion.

2. The semiconductor light emitting device according to claim 1, wherein a distal end portion of the lead terminal is located within an area defined by the cut portion and the extension lines when viewed from the upper surface of the outer surrounding body.

3. A semiconductor light emitting device comprising:
   an outer surrounding body;
   a metallic body covered by the outer surrounding body;
   a lead terminal led from a side surface of the outer surrounding body; and
   a semiconductor light emitting element disposed on the metallic body,
   wherein the outer surrounding body has a recessed portion that exposes a part of the metallic body,
   wherein the semiconductor light emitting element is disposed in the recessed portion and covered by a light transmitting resin, and
   wherein the outer surrounding body has a cut portion formed at a corner defined by a cross point of extension lines of adjacent sides of a planar outline of the outer surrounding body viewed from an upper surface of the outer surrounding body, and
   wherein the lead terminal is protruded out from the cut portion.

4. The semiconductor light emitting device according to claim 3, wherein a distal end portion of the lead terminals is located within an area defined by the cut portion and the extension lines when viewed from the upper surface of the outer surrounding body.

5. A semiconductor light emitting unit comprising:
   a first semiconductor light emitting device;
   a second semiconductor light emitting device; and
   an electrode,
   wherein each of the first semiconductor light emitting device and the second semiconductor light emitting device comprises:
      an outer surrounding body having a recessed portion formed on an upper surface of the outer surrounding body;
      a lead terminal led out from a side surface of the outer surrounding body; and
      a semiconductor light emitting element disposed in the recessed portion,
      wherein the outer surrounding body has a cut portion formed at a corner defined by a cross point of extension lines of adjacent sides in a planar outline of the outer surrounding body viewed from the upper surface of the outer surrounding body, and
      wherein the lead terminal is protruded out from the cut portion;
   wherein one side surface of the outer surrounding body of the first semiconductor light emitting device is arranged to oppose in parallel to one side surface of the outer surrounding body of the second semiconductor light emitting device, such that the cut portion of the first semiconductor light emitting device opposes the cut portion of the second semiconductor light emitting device, and
   wherein the lead terminal of the first semiconductor light emitting device and the lead terminal of the second semiconductor light emitting device are connected to the electrode.

* * * * *